United States Patent
Nitta et al.

(10) Patent No.: US 7,540,318 B2
(45) Date of Patent: Jun. 2, 2009

(54) HEAT SINK

(75) Inventors: Kazuhiro Nitta, Kawasaki (JP); Keizou Takemura, Kawasaki (JP); Kenji Katsumata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 448 days.

(21) Appl. No.: 11/525,926

(22) Filed: Sep. 25, 2006

(65) Prior Publication Data

US 2007/0272399 A1    Nov. 29, 2007

(30) Foreign Application Priority Data

May 25, 2006    (JP)    ............................. 2006-145669

(51) Int. Cl.
*F28D 15/04*    (2006.01)
*H05K 7/20*    (2006.01)

(52) U.S. Cl. .................. 165/104.26; 257/715; 361/700

(58) Field of Classification Search ............ 165/104.26, 165/104.33; 257/715; 361/700; 29/890.032
See application file for complete search history.

(56) References Cited

U.S. PATENT DOCUMENTS

| | | | | |
|---|---|---|---|---|
| 3,746,081 A | * | 7/1973 | Corman et al. | ......... 165/104.26 |
| 3,754,594 A | * | 8/1973 | Ferrell | .................. 165/104.26 |
| 3,921,710 A | * | 11/1975 | Katayama | ............... 165/104.26 |
| 4,003,427 A | * | 1/1977 | Leinoff et al. | .......... 165/104.26 |
| 4,118,756 A | * | 10/1978 | Nelson et al. | ................ 361/700 |
| 5,216,580 A | | 6/1993 | Davidson et al. | |
| 5,253,702 A | * | 10/1993 | Davidson et al. | ....... 165/104.26 |
| 5,632,158 A | * | 5/1997 | Tajima | ................... 165/104.26 |
| 6,738,257 B1 | * | 5/2004 | Lai | ............................ 361/700 |
| 6,896,040 B2 | * | 5/2005 | Hul-Chun | .............. 165/104.26 |
| 2004/0069460 A1 | * | 4/2004 | Sasaki et al. | ........... 165/104.26 |
| 2006/0219391 A1 | * | 10/2006 | Hong et al. | ............. 165/104.26 |
| 2007/0064396 A1 | * | 3/2007 | Oman | ........................ 361/700 |

FOREIGN PATENT DOCUMENTS

| | | |
|---|---|---|
| JP | 6-13511 | 1/1994 |
| JP | 7-142652 | 6/1995 |
| JP | 7-263601 | 10/1995 |

* cited by examiner

*Primary Examiner*—Leonard R Leo
(74) *Attorney, Agent, or Firm*—Staas & Halsey LLP

(57) ABSTRACT

A heat sink includes a first heat pipe having a flat plate-shape and a second heat pipe connected perpendicularly to the first heat pipe. The first heat pipe has a first wick provided along an inner surface thereof. The second heat pipe has a second wick provided along an inner surface thereof. Each of end portions of the first and second wicks in a connecting portion of the first and second heat pipes has a comb-toothed part formed in a convexoconcave form like teeth of a comb so that the first and second wicks are connected by the comb-toothed parts fitting to each other. The comb-toothed parts of the second wick traverses an interior of the first heat pipe and contacts with the first wick on an opposite side.

10 Claims, 9 Drawing Sheets

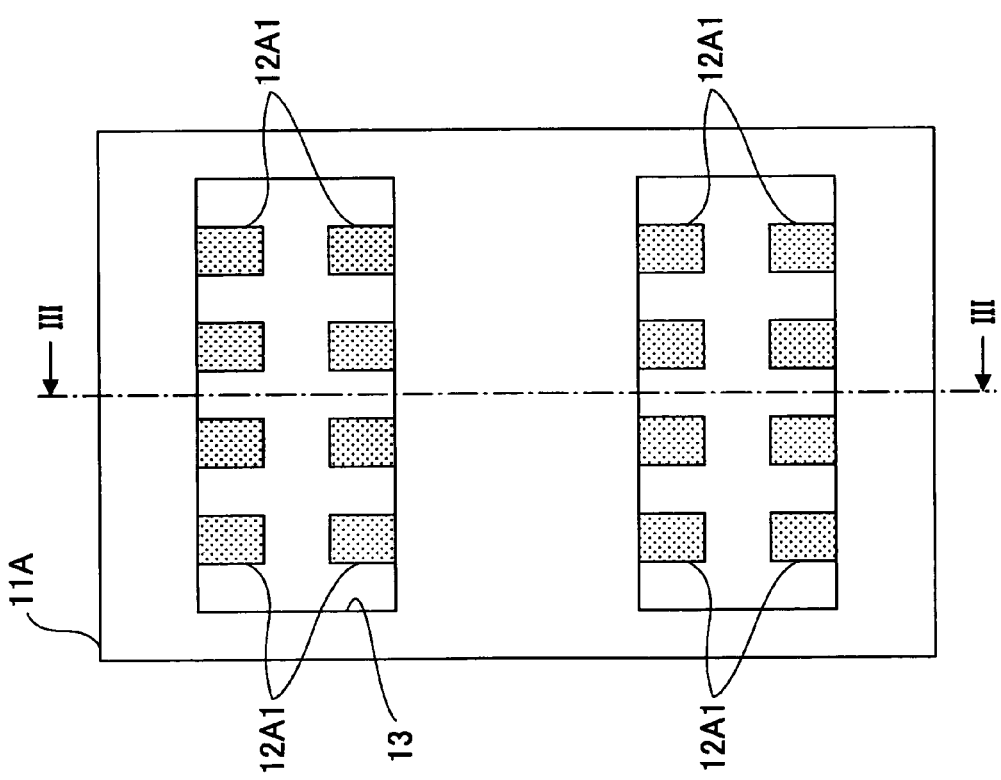

HEAT SINK

BACKGROUND OF THE INVENTION

1. Field of the Invention

The present invention relates to heat sinks and, more particularly, to a heat sink having a heat pipe suitable for cooling a semiconductor device or the like.

2. Description of the Related Art

In recent years, as a cooling device for cooling a semiconductor device generating a large amount of heat, a heat sink using a heat pipe having an extremely high heat transfer performance. In a conventional heat pipe, heat is absorbed in a heat absorbing part by a cooling medium sealed within a pipe or a flat plate-shaped container being evaporated in the heat absorbing part. The evaporated cooling medium moves to a heat radiating part and cooled so as to be liquefied, resulting in the heat absorbed in the heat absorbing part being radiated. The cooling medium liquefied in the heat radiating part spreads into a mesh or fiberform member referred to as a wick, and moves through the wick according to a capillary phenomenon and returns to the heat absorbing part, and is evaporated again and moves to the heat radiating part.

As a cooling medium enclosed in a heat pipe, pure water is used in many cases. In order to lower an evaporation temperature and to make an operation temperature low, the interior of the heat pipe in which a cooling medium is enclosed may be set to a reduce pressure. Moreover, a container of a heat pipe is formed of copper or aluminum, which has a high thermal conductivity, in many cases.

When arranging a heat pipe as a heat sink, it is general to increase a heat radiation efficiency by attaching heat radiation fins to a heat radiation part. In order to increase the heat radiation efficiency further, the heat radiation part may be enlarged. For example, there may be a structure in which a heat pipe is formed as a flat plate-shaped container and heat radiation fins are attached to one of flat surfaces. Additionally, there is a structure in which a long heat pipe is accommodated in a small volume by bending the bar-like heat pipe in a U-shape.

It is also suggested to acquire a higher heat radiation efficiency by increasing a volume inside a heat pipe by making the heat pipe itself into a three-dimensional construction. In order to increase the volume inside the heat pipe, it is considered to make the heat pipe itself to have a three-dimensional construction.

For example, there is suggested a heat sink having a structure in which a rod-like heat pipe is bent in a channel shape so form a three-dimensional construction and opposite ends thereof are inserted into a base member forming heat radiation fins (for example, refer to Patent Document 1). Additionally, there is suggested a heat pipe having a structure in which one heat pipe is connected perpendicular to another heat pipe and interiors of the heat pipes are caused to communicate with each other (for example, refer to Patent Documents 2 and 3).

Patent Document 1: Japanese Laid-Open Patent Application No. 6-13511

Patent Document 2: Japanese Laid-Open Patent Application No. 7-142652

Patent Document 3: Japanese Laid-Open Patent Application No. 7-263601

In the heat sink disclosed in the above-mentioned Patent Document 1, a three-dimensional structure is formed by bending a heat pipe. However, since a wick is attached to an inner surface of the heat pipe, the wick may be cut when bending the heat pipe. If the wick is cut, a flow of the cooling medium is blocked, which results in a decrease in the cooling efficiency. Additionally, it is difficult to bend a flat plate-shaped heat pipe unlike rod-like heat pipe.

Although the heat sinks disclosed in Patent Documents 2 and 3, have a flat plate-shaped heat pipe connected with a plurality of flat plate-shaped heat pipes perpendicularly, there is no description of a structure of a wick. For example, it is assumed that two flat plate-shaped heat pipes 1A and 1B are connected with each other as shown in FIG. 1. In this case, it is needed to connect wicks 2A and 2B attached to inner surfaces to each other. However, if the wicks 2A and 2B are connected at a connecting part of the heat pipes, a liquid transportation path length to a heat receiving part (that is, a cooling part contacting a heat generating member 3) becomes long. Thus, there is a problem in that a thermal transportation efficiency is decreased due to a cooling medium returning a heat receiving part along the wick by turning to a liquid. In FIG. 1, flows of the cooling medium are indicated by arrows. Additionally, if the wicks are not connected well at the connecting part, and in a top heat in which the heat receiving part is located up or side (that is, an arrangement in which a heat generating member is attached to an upper portion or a side portion of the heat pipe), a flow of the liquid cooling medium is blocked at a cut portion of the wicks, which causes a problem in that the cooling medium cannot be transported to the heat receiving part.

As mentioned above, although there were suggestions to connect heat pipes three-dimensionally, they are not a connection structure in which a consideration is given to a flow of a cooling medium inside. There is no consideration of a connection method of wicks in a plurality of heat pipes at all.

SUMMARY OF THE INVENTION

It is a general object of the present invention to provide a novel and useful heat sink in which the above-mentioned problems are eliminated.

A more specific object of the present invention is to provide a heat sink in which wicks are surely connected even if a three-dimensional structure is made by connecting a plurality of heat pipes so that the wicks maintain a cooling performance high even if it is a top heat.

In order to achieve the above-mentioned objects, there is provided according to the present invention a heat sink comprising: a first heat pipe having a flat plate-shape; and a second heat pipe connected perpendicularly to the first heat pipe, wherein the first heat pipe has a first wick provided along an inner surface thereof, the second heat pipe has a second wick provided along an inner surface thereof, each of end portions of the first and second wicks in a connecting portion of the first and second heat pipes has a comb-toothed part formed in a convexoconcave form like teeth of a comb so that the first and second wicks are connected by the comb-toothed parts fitting to each other, and the comb-toothed part of the second wick traverses an interior of the first heat pipe and contacts with the first wick on an opposite side.

In the heat sink according to the present invention, the first heat pipe may be provided with a heat-receiving part. The first and second wicks may be formed of a porous sintered sheet. The second heat pipe may include two pieces of heat pipes perpendicularly connected to the first heat pipe in parallel to each other, and a heat-receiving part may be provided on an opposite side of a side of the first heat pipe where the second heat pipe is connected. Additionally, the two pieces of heat pipes of the second heat pipe may be connected to the same surface of the first heat pipe, and heat-radiation fins may be provided between the two pieces of heat pipes of the second heat pipe in parallel to the surface of the first heat pipe. The heat sink may further comprise heat-radiation fins provided perpendicular to the surface of the first heat pipe. In the heat sink according to the present invention, the two heat pipes of the second heat pipe may be connected to opposite ends of the same surface of the first heat pipe, respectively, and heat-radiation fins may be provided between the two heat pipes of the second heat pipe in parallel to the surface of the first heat pipe.

Additionally, the heat sink according to the present invention may further comprise a third heat pipe connected perpendicular to the two heat pipes of the second heat pipe, wherein the third heat pipe may have a third wick provided along an inner surface thereof, each of end portions of the second and third wicks in a connecting portion of the second and third heat pipes may have a comb-toothed part formed in a convexoconcave form like teeth of a comb so that the second and third wicks are connected by the comb-toothed parts fitting to each other, and the comb-toothed part of the second wick may traverse an interior of the third heat pipe and contacts with the third wick on an opposite side. The first heat pipe and the third heat pipe may be connected to opposite ends of the second heat pipe facing and parallel to each other, and heat radiation fins may be provided parallel to the second heat pipe between the third heat pipe and the first heat pipe. One of the first and third heat pipes may be provided with a heat-receiving part.

According to the present invention, wicks attached to inner surfaces of a heat pipe having a three-dimensional structure can be surely connected to each other so that a liquid cooling medium can be transported to a heat-receiving part through the wicks. Accordingly, the liquid cooling medium can be surely transported to the heat-receiving part even in a top-heat use, and a cooling performance can be improved. Additionally, since the comb-toothed part extends and contacts the opposite side wick in the connecting portion of on the end of the wick, the liquid transportation path by the wicks can be shortened. Thereby, the thermal transportation efficiency by the heat pipes can be increased, which results in formation of a heat sink having a three-dimensional structure of a high cooling performance.

Other objects, features and advantages of the present invention will become more apparent from the scope of the present invention.

BRIEF DESCRIPTION OF THE DRAWINGS

FIG. 3A is a plan view of a part of the heat pipe shown in FIG. 2;

FIG. 3B is a cross-sectional view taken along a line III-III of FIG. 3A;

DETAILED DESCRIPTION OF THE PREFERRED EMBODIMENTS

A description will now be given, with reference to the drawings, of an embodiment of the present invention.

Figure 1:
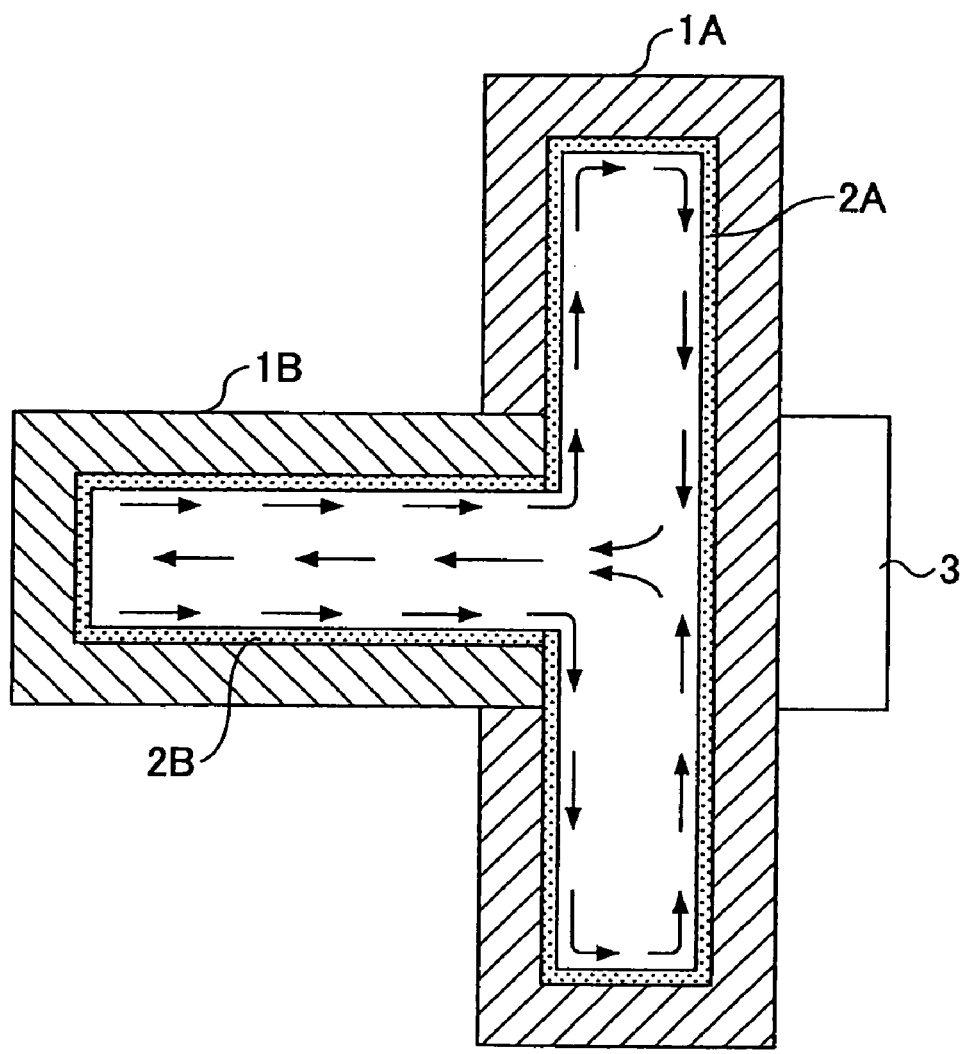
FIG. 1 is a cross-sectional view of heat pipes connected according to a conventional structure of connection.
Figure 2:
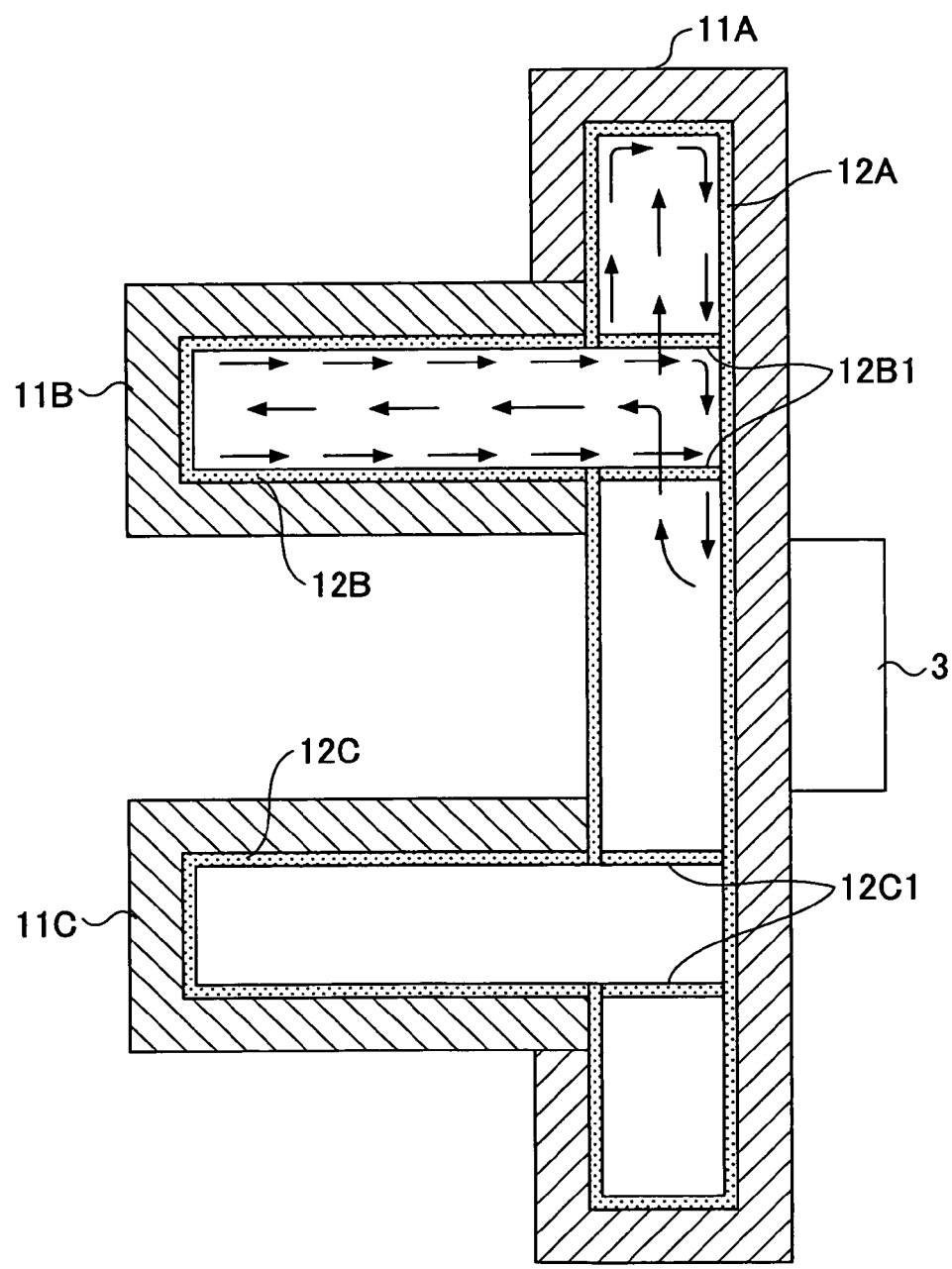
FIG. 2 is a cross-sectional view of a heat pie according to an embodiment of the present invention.

FIG. 2 is a cross-sectional view of a heat pipe having a three-dimensional structure according to an embodiment of the present invention. In FIG. 2, a heat pipe 11A is a plate-shaped heat pipe, and heat pipes 11B and 11C are attached perpendicularly to the heat pipe 11A. The heat pipes 11B and 11C may be plate-shaped or rod-shaped. Inner spaces of the heat pipes 11B and 11C in which a cooling medium (operation fluid) is charged are communicated with an inner space of the heat pipe 11A in which the cooling medium (operation fluid) is also charged.

Wicks 12A, 12B and 12C are applied onto entire inner surfaces of the heat pipes 11A, 11B and 11C, respectively. The wicks 12A, 12B, and 12C are mesh or fiberform members or porous sheet members formed of a material having a good thermal conductivity, and configured to be capable of transporting a liquefied cooling medium according to a capillary phenomenon.

A heat-generating element 3 is attached to the heat pipe 11A, and a portion to which the heat-generating element 3 is attached serves as a heat-receiving part. The liquefied cooling medium spread into the wick 12A in the heat-receiving part absorbs heat and evaporates to be turned into gas. A part of the evaporated cooling medium moves in directions toward opposite ends of the heat pipe 11A, and also a part of the evaporated cooling medium moves to interiors of the heat pipes 11B and 1C. The opposite ends of the heat pipe 11A and the heat pipes 11B and 11C together serve as a heat-radiating part. That is, the gasiform cooling medium, which has moved to the opposite end sides of the heat pipe 11A and the interiors of the heat pipes 11B and 11C, is cooled and liquefied by being brought into contact with the wicks 12A, 12B and 12C. The liquid cooling medium spreads into the wicks 12A, 12B and 12C when it is liquefied, and returns to the heat-receiving part of the heat pipe 11A by moving through the wicks according to a capillary phenomenon. In the above-mentioned cycle of the cooling medium, a pressure is generated in the interiors of the heat pipes 11A, 11B and 11C, and the cooling medium circulates efficiently between the heat-receiving part and the heat-radiating part to transport heat.

Here, the liquid cooling medium, which moves inside the wicks 12B and 12C, cannot move to the wick 12A unless the wick 12A is connected to the wicks 12B and 12C, and the cooling medium cannot be circulated efficiently. Moreover, the liquid cooling medium spread into an upper portion of the wick 12B in FIG. 2 moves to the heat-receiving part by going through an upper end portion of the heat pipe 11A (wick 12A), which results in a long transportation path of the liquid cooling medium.

Thus, in the present embodiment, a heat pipe having a three-dimensional structure is configured so that the wick 12A is connected well to the wicks 12B and 12C by providing a special structure to the connection structure between the wick 12A and the wicks 12B and 12C and a distance from each of the wicks 12B and 12C to the heat-receiving part is shortened.

Figure 4A:
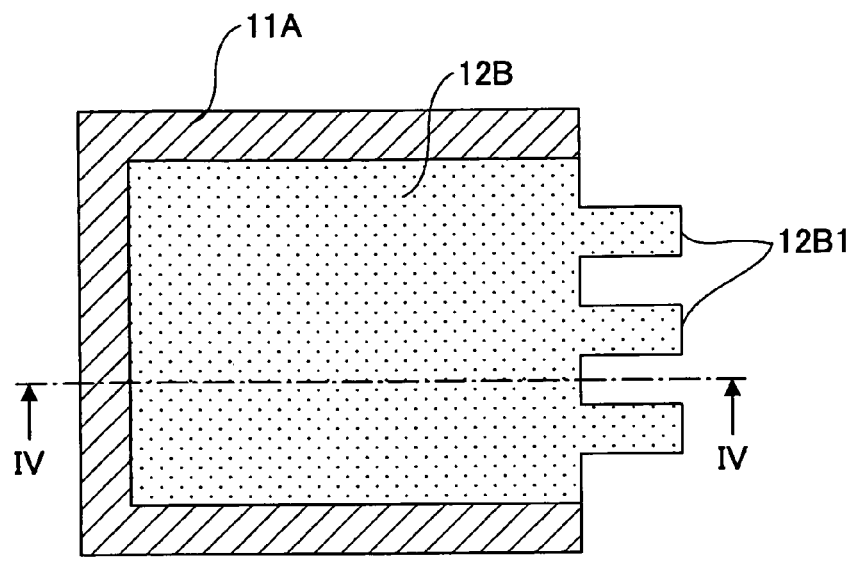
FIG. 4A is a horizontal cross-sectional view of a part of the heat pipe shown in FIG. 2.
Figure 4B:
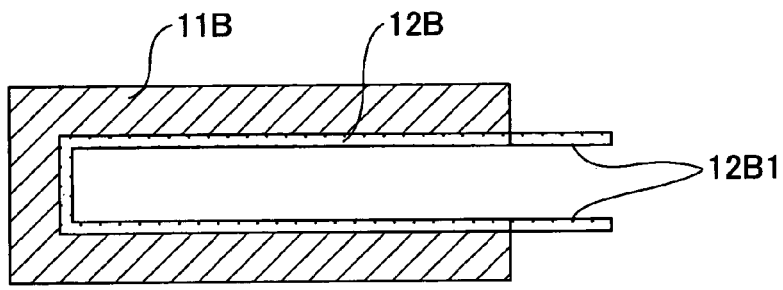
FIG. 4B is a cross-sectional view taken along a line III-III of FIG. 4A.
Figure 5:
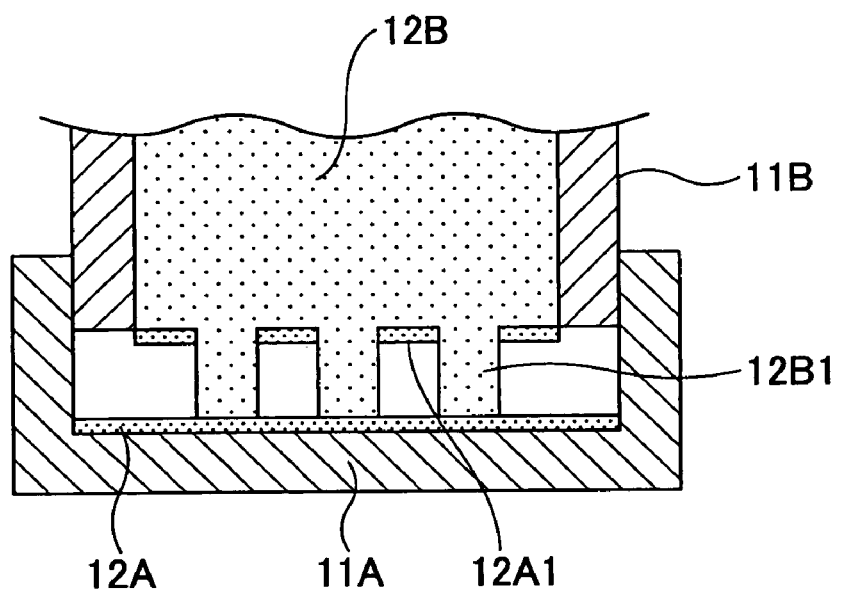
FIG. 5 is a cross sectional view of a connecting portion of wicks.

A description will now be given, with reference to FIGS. 3 through 5, of the connection structure of the wicks. FIG. 3A is a plan view of the heat pipe 11A before the heat pipes 11B and 11C are attached. FIG. 3B is a cross-sectional view taken along a line III-III of FIG. 3A. FIG. 4A is a horizontal cross-sectional view of the heat pipe 11B before being attached to the heat pipe 11A. FIG. 4B is a cross-sectional view taken along a line IV-IV of FIG. 4A. FIG. 5 is a cross-sectional view showing the connecting portion between the wick 12A and the wick 12B. It should be noted that the connecting portion between the wick 12A and the wick 12C has the same structure as the connecting portion between the wick 12A and the wick 12B, and, thus, only the connecting portion between the wick 12A and the wick 12B will be explained.

As shown in FIG. 3, the heat pipe 11A has an opening 13 in a portion to which the heat pipe 11B is connected. The heat pipe 11B is fixed to the heat pipe 11A in a state where it is inserted into the opening 13. In the opening 13, a plurality of comb-tooth portions 12A1 of a comb-toothed part formed in the wick 12A are protruded.

As shown in FIG. 4, the wick 12B of the heat pipe 11B has a plurality of comb-tooth portions 12B1 of a comb-toothed part on the side connected to the heat pipe 11A. Each of the comb-toot portions 12B1 is formed in a shape which can be inserted into a space between the adjacent comb-tooth portions 12A1 of the wick 12A of the heat pipe 11A. That is, the comb-tooth portions 12A1 and the comb-tooth portions 12B1 are configured and arranged to fit to each other as shown in FIG. 5. Additionally, the comb-tooth portions 12B1 extend through the inner space of the heat pipe 11A as shown in FIG. 5 in the state where the heat pipe 11B is attached to the heat pipe 11A. The comb-tooth portions 12B1 are formed to have a length with which the ends thereof are in contact with the wick 12A of the heat pipe 11A.

As mentioned above, since the wick 12A and the wick 12B are connected by the comb-tooth portions 12A1 and the comb-tooth portions 12B1 intruding mutually, the wick 12A and the wick 12B can be surely brought into contact with each other. For this reason, the wick 12A and the wick 12B are connected surely with each other, and a flow of the liquid cooling medium according to a capillary phenomenon is not cut between the wick 12A and the wick 12B. Therefore, the liquid cooling medium can be surely moved from the wick 12B to the wick 12A.

Moreover, a space is formed between the adjacent comb-tooth portions 12B1, and the gasiform cooling medium can move freely through this space. Accordingly, even in a structure where the wick 12B is extended through the inner space of the heat pipe 11A so as to be in contact with the wick 12A, the inner space of the heat pipe 11A is not blocked by the wick 12B, which acquire a sufficient flow path of the gasiform cooling medium.

According to the above-mentioned connection structure of the wicks, as indicated by arrows in FIG. 2, the circulation path of the cooling medium can be formed in a short path, which improves a thermal transportation efficiency.

It should be noted that the wick 12C of the heat pipe 11C also has the comb-tooth portions 12C1, and the wick 12C is connected to the wick 12A with the same connection structure as the wick 12B.

A description will now be given of a heat sink having the heat pipe of the three-dimensional structure in which the wicks are connected by the above-mentioned connection structure.

Figure 6A:
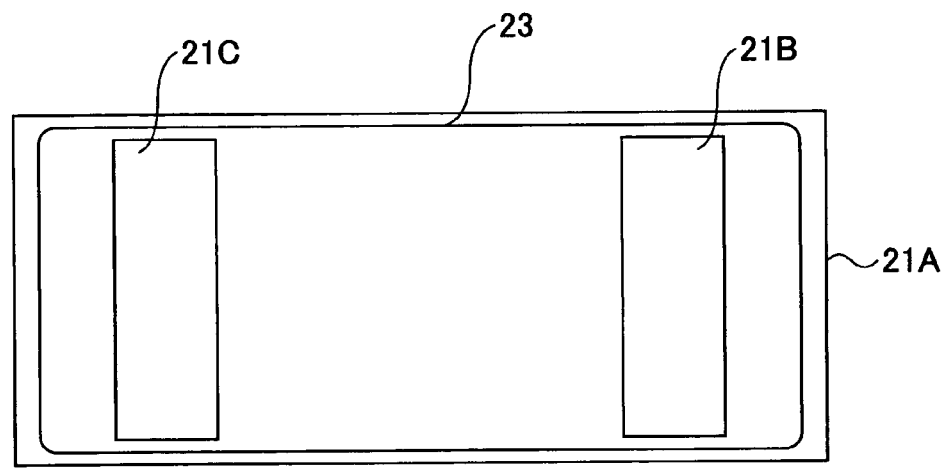
FIG. 6A is a plan view of a heat sink according to a first embodiment.
Figure 6B:
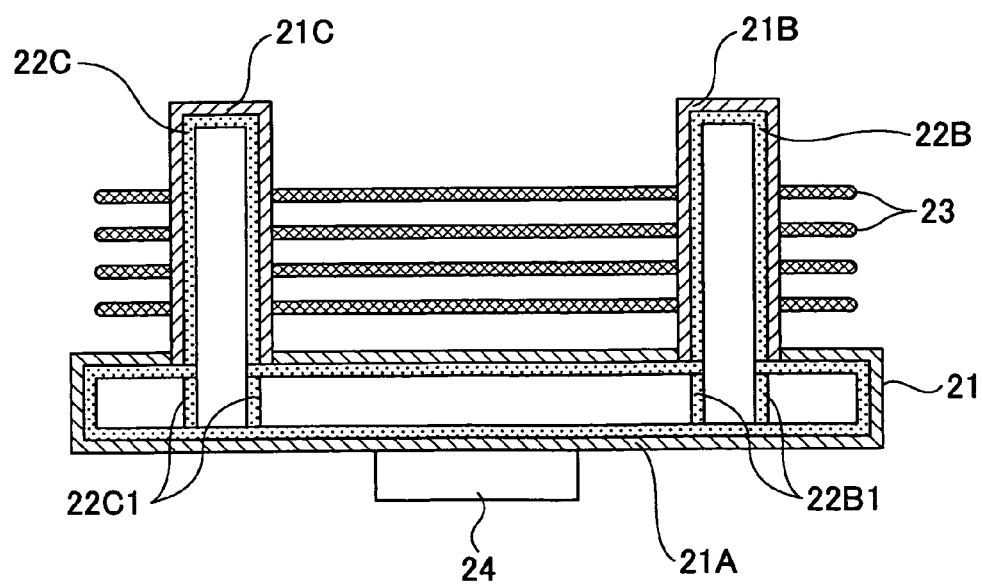
FIG. 6B is a cross-sectional view of the heat sink shown in FIG. 6A.

FIG. 6A is a plan view of a heat sink according to a first embodiment. FIG. 6B is a cross-sectional view of the heat sink shown in FIG. 6A. The heat sink shown in FIGS. 6A and 6B has a three-dimensional structure in which plate-shaped heat pipes 21B and 21C are perpendicularly connected to a plate-shaped heat pipe 21A. A plurality of heat-radiating fins 23 are attached parallel to the heat pipe 21A so as to bridge between the heat pipes 21B and 21C. The wick 22A in the heat pipe 21A and the wicks 22B and 22C in the heat pipes 21B and 21C are connected according to the connection structure explained with reference to FIG. 2 through FIG. 5. In the present embodiment, a center portion serving as a heat-receiving part of the heat pipe 21A is joined to a semiconductor device 24 as a heat-generating member so that the heat sink 20 serves as a cooling device for cooling the semiconductor device 24.

Figure 7:
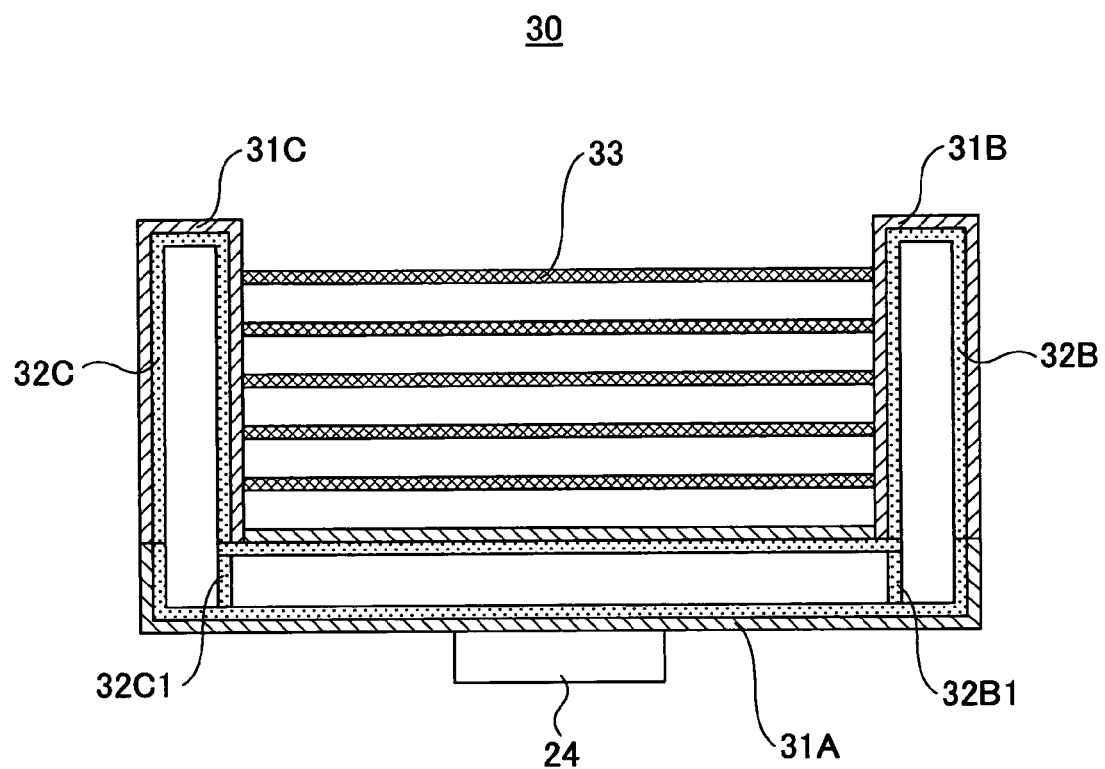
FIG. 7 is a cross-sectional view of a heat sink according to a second embodiment.

FIG. 7 is a cross-sectional view of a heat sink according to a second embodiment. The heat sink shown in FIG. 7 has a three-dimensional structure in which heat pipes 31B and 31C are connected to opposite ends of a heat pipe 31A. A plurality of heat-radiating fins 33 are attached parallel to the heat pipe 31A to bridge between the heat pipe 31B and 31C. A wick 32A in the heat pipe 31A and inner-side portions of wicks 32B and 32C in the heat pipes 31B and 31C are connected according to the connection structure explained with reference to FIG. 2 through FIG. 5. In the present embodiment, a center portion serving as a heat-receiving part of the heat pipe 31A is joined to a semiconductor device 24 as a heat-generating member so that the heat sink 30 serves as a cooling device for cooling the semiconductor device 24.

Figure 8:
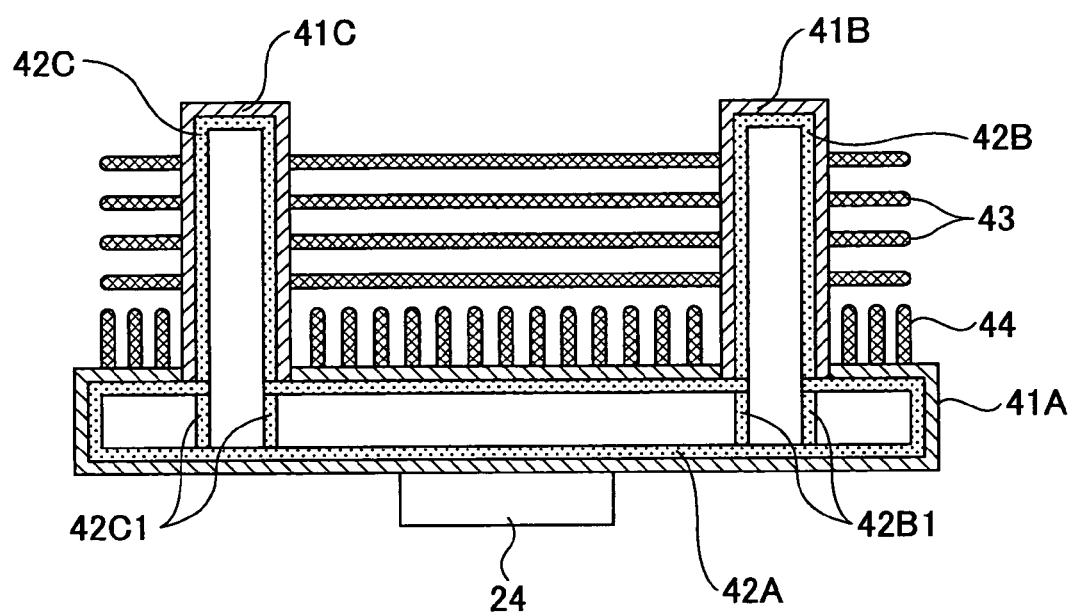
FIG. 8 is a cross-sectional view of a heat sink according to a third embodiment.

FIG. 8 is a cross-sectional view of a heat sink according to a third embodiment. The heat sink 40 shown in FIG. 8 has the same structure as the heat sink 20 shown in FIGS. 6A and 6B except for heat-radiating fins 44 attached perpendicularly to a heat pipe 41A. That is, the heat sink shown in FIG. 8 has a three-dimensional structure in which heat pipes 41B and 41C are connected to opposite ends of the heat pipe 41A. A plurality of heat-radiating fins 43 are attached parallel to the heat pipe 41A to bridge between the heat pipe 41B and 41C. A wick 42A in the heat pipe 41A and the wicks 42B and 42C in the heat pipes 41B and 41C are connected according to the connection structure explained with reference to FIG. 2 through FIG. 5. In the present embodiment, a center portion serving as a heat-receiving part of the heat pipe 41A is joined to a semiconductor device 24 as a heat-generating member so that the heat sink 40 serves as a cooling device for cooling the semiconductor device 24.

Figure 9:
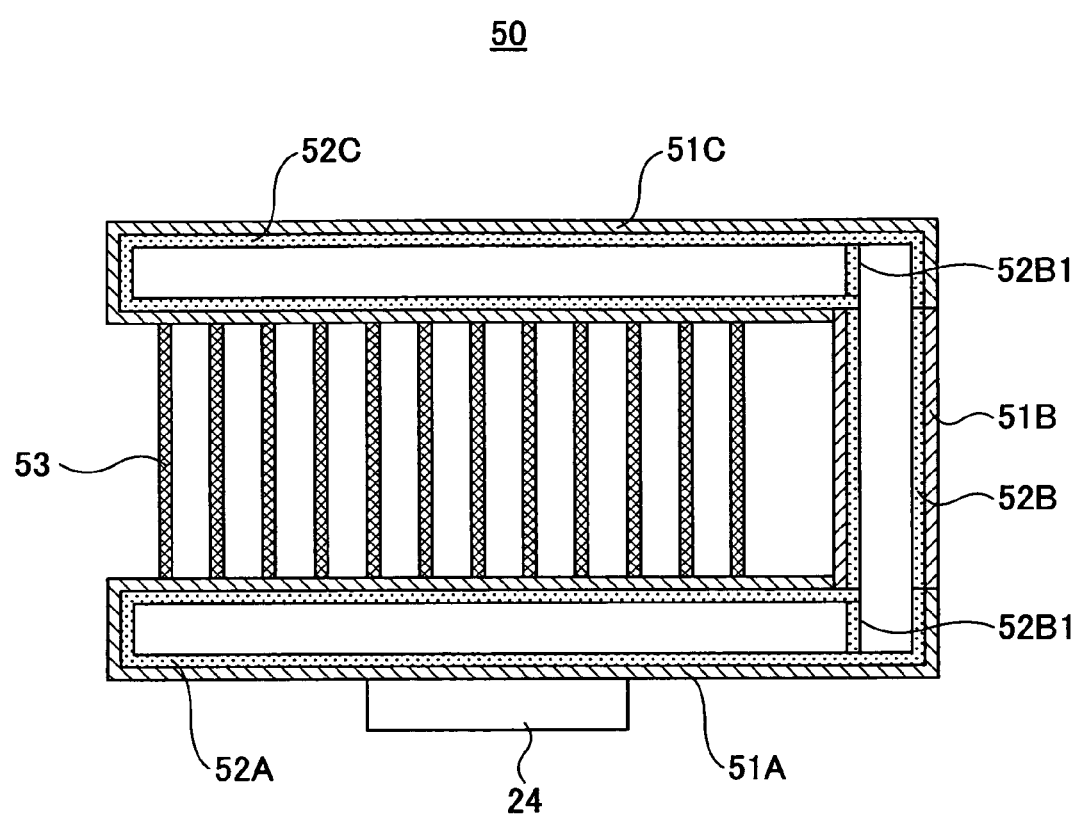
FIG. 9 is a cross-sectional view of a heat sink according to a fourth embodiment.

FIG. 9 is a cross-sectional view of a heat sink according to a fourth embodiment. The heat sink 50 shown in FIG. 9 has a three-dimensional structure in which a plate-shaped heat pipe 51B is perpendicularly connected to an end of a plate-shaped heat pipe 51A, and a plate-shaped heat pipe 51C is perpendicularly connected to an end of the heat pipe 51B. A plurality of heat-radiating fins 53 are attached parallel to the heat pipe 51B so as to bridge between the heat pipes 51A and 51B. A wick 52B in the heat pipe 51B and wicks 52A and 52C of the heat pipes 51A and 51C are connected according to the connection structure explained with reference to FIG. 2 through FIG. 5. In the present embodiment, a center portion serving as a heat-receiving part of the heat pipe 51A is joined to a semiconductor device 24 as a heat-generating member so that the heat sink 50 serves as a cooling device for cooling the semiconductor device 24. A center portion of the heat pipe 51C may be formed as a heat-receiving part and the heat pipe 51 may be joined to the semiconductor device 24.

The present invention is not limited to the specifically disclosed embodiments, and variations and modifications may be made without departing from the scope of the present invention.

Present application is based on Japanese priority application No. 2006-145669 filed May 25, 2006, the entire contents of which are hereby incorporated herein by reference.

What is claimed is:

1. A heat sink comprising:
   a first heat pipe having a flat plate-shape; and
   a second heat pipe connected perpendicularly to the first heat pipe,
   wherein said first heat pipe has a first wick provided along an inner surface thereof,
   said second heat pipe has a second wick provided along an inner surface thereof,
   each of end portions of said first and second wicks in a connecting portion of said first and second heat pipes has a comb-toothed part formed in a convexoconcave form like teeth of a comb so that said first and second wicks are connected by the comb-toothed parts fitting to each other, and
   said comb-toothed part of said second wick traverses an interior of said first heat pipe and contacts with said first wick on an opposite side.

2. The heat sink as claimed in claim 1, wherein said first heat pipe is provided with a heat-receiving part.

3. The heat sink as claimed in claim 1, wherein said first and second wicks are formed of a porous sintered sheet.

4. The heat sink as claimed in claim 1, wherein said second heat pipe includes two pieces of heat pipes perpendicularly connected to said first heat pipe in parallel to each other, and a heat-receiving part is provided on an opposite side of a side of said first heat pipe where said second heat pipe is connected.

5. The heat sink as claimed in claim 4, wherein said two pieces of heat pipes of said second heat pipe are connected to the same surface of said first heat pipe, and heat-radiation fins are provided between said two pieces of heat pipes of said second heat pipe in parallel to the surface of said first heat pipe.

6. The heat sink as claimed in claim 5, further comprising heat-radiation fins provided perpendicular to said surface of said first heat pipe.

7. The heat sink as claimed in claim 4, wherein said two heat pipes of said second heat pipe are connected to opposite ends of the same surface of said first heat pipe, respectively, and heat radiation fins are provided between said two heat pipes of said second heat pipe in parallel to the surface of said first heat pipe.

8. The heat sink as claimed in claim 1, further comprising a third heat pipe connected perpendicular to said two heat pipes of said second heat pipe,
   wherein said third heat pipe has a third wick provided along an inner surface thereof,
   each of end portions of said second and third wicks in a connecting portion of said second and third heat pipes has a comb-toothed part formed in a convexoconcave form like teeth of a comb so that said second and third wicks are connected by the comb-toothed parts fitting to each other, and
   said comb-toothed part of said second wick traverses an interior of said third heat pipe and contacts with said third wick on an opposite side.

9. The heat sink as claimed in claim 8, wherein said first heat pipe and said third heat pipe are connected to opposite ends of said second heat pipe facing and parallel to each other, and heat-radiation fins are provided parallel to said second heat pipe between said third heat pipe and said first heat pipe.

10. The heat sink as claimed in claim 9, wherein one of said first and third heat pipes is provided with a heat-receiving part.

\* \* \* \* \*